(12) United States Patent
Nakamura et al.

(10) Patent No.: US 7,119,857 B1
(45) Date of Patent: Oct. 10, 2006

(54) APPARATUS AND MANUFACTURE METHOD FOR FLAT DISPLAY

(75) Inventors: Takafumi Nakamura, Hino (JP); Yasuyuki Hanazawa, Fukaya (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 292 days.

(21) Appl. No.: 09/667,566

(22) Filed: Sep. 22, 2000

(30) Foreign Application Priority Data

Sep. 24, 1999 (JP) .................................. 11-271173
Sep. 18, 2000 (JP) ............................. 2000-281164

(51) Int. Cl.
*G02F 1/1343* (2006.01)
*G02F 1/136* (2006.01)

(52) U.S. Cl. .......................................... 349/38; 349/43
(58) Field of Classification Search ............ 349/38–43, 349/143, 54, 139
See application file for complete search history.

(56) References Cited

U.S. PATENT DOCUMENTS

| 4,728,175 | A | * | 3/1988 | Baron | 349/38 |
|---|---|---|---|---|---|
| 5,668,650 | A | * | 9/1997 | Mori et al. | 349/42 |
| 5,691,793 | A | * | 11/1997 | Watanabe et al. | 349/155 |
| 6,088,071 | A | * | 7/2000 | Yamamoto et al. | 349/38 |
| 6,141,066 | A | * | 10/2000 | Matsushima | 349/38 |
| 6,317,173 | B1 | * | 11/2001 | Jung et al. | 349/42 |
| 6,515,720 | B1 | * | 2/2003 | Iizuka et al. | 349/39 |

FOREIGN PATENT DOCUMENTS

JP    2000-187248    4/2000

* cited by examiner

*Primary Examiner*—Dung T. Nguyen
(74) *Attorney, Agent, or Firm*—Oblon, Spivak, McClelland, Maier & Neustadt, P.C.

(57) ABSTRACT

There is disclosed a method of manufacturing a flat display in which a switching element (TFT) having caused a display pixel defect can securely be repaired. The flat display of the present invention is formed by forming a semiconductor layer and an auxiliary capacity electrode in the same layer on a glass substrate, forming a gate insulating film on a top surface, forming a gate electrode and an auxiliary capacity feeder in the same layer on the top surface, forming an interlayer insulating film on a top surface, and forming a source electrode and drain electrode on a top surface. Since a wiring portion between the auxiliary capacity electrode and the pixel electrode is irradiated with laser to increase the resistance of a wiring portion, the pixel electrode fails to be influenced by a voltage of the auxiliary capacity feeder, occurrence of the display pixel defect can be reduced, and manufacture yield can be enhanced.

6 Claims, 12 Drawing Sheets

DEPENDENCE OF LASER ENERGY INTENSITY
ON WIRING VOLUME

APPARATUS AND MANUFACTURE METHOD FOR FLAT DISPLAY

CROSS REFERENCE TO RELATED APPLICATIONS

The subject application is related to subject matter disclosed in Japanese Patent Applications No. H11-271173 filed on Sep. 24, 1999 and No. H12-281164 filed on Sep. 18, 2000 in Japan to which the subject application claims priority under Paris Convention and which is incorporated herein by reference.

BACKGROUND OF THE INVENTION

1. Field of the Invention

The present invention relates to a flat display in which an auxiliary capacity is connected to a pixel displaying switching element and a method of manufacturing the display, and it relates, for example, to an active matrix liquid crystal display.

2. Related Background Art

A liquid crystal display, provided with great advantages such as a high image quality, thinness/lightweight, and low power consumption, is broadly utilized in a notebook-size personal computer, a portable electronic apparatus, and the like. Particularly, in recent years, the liquid crystal display has been intensively developed/researched in which a thin film transistor (hereinafter referred to as TFT) by a polycrystalline silicon with a high mobility is used in a pixel switching element.

Figure 1:
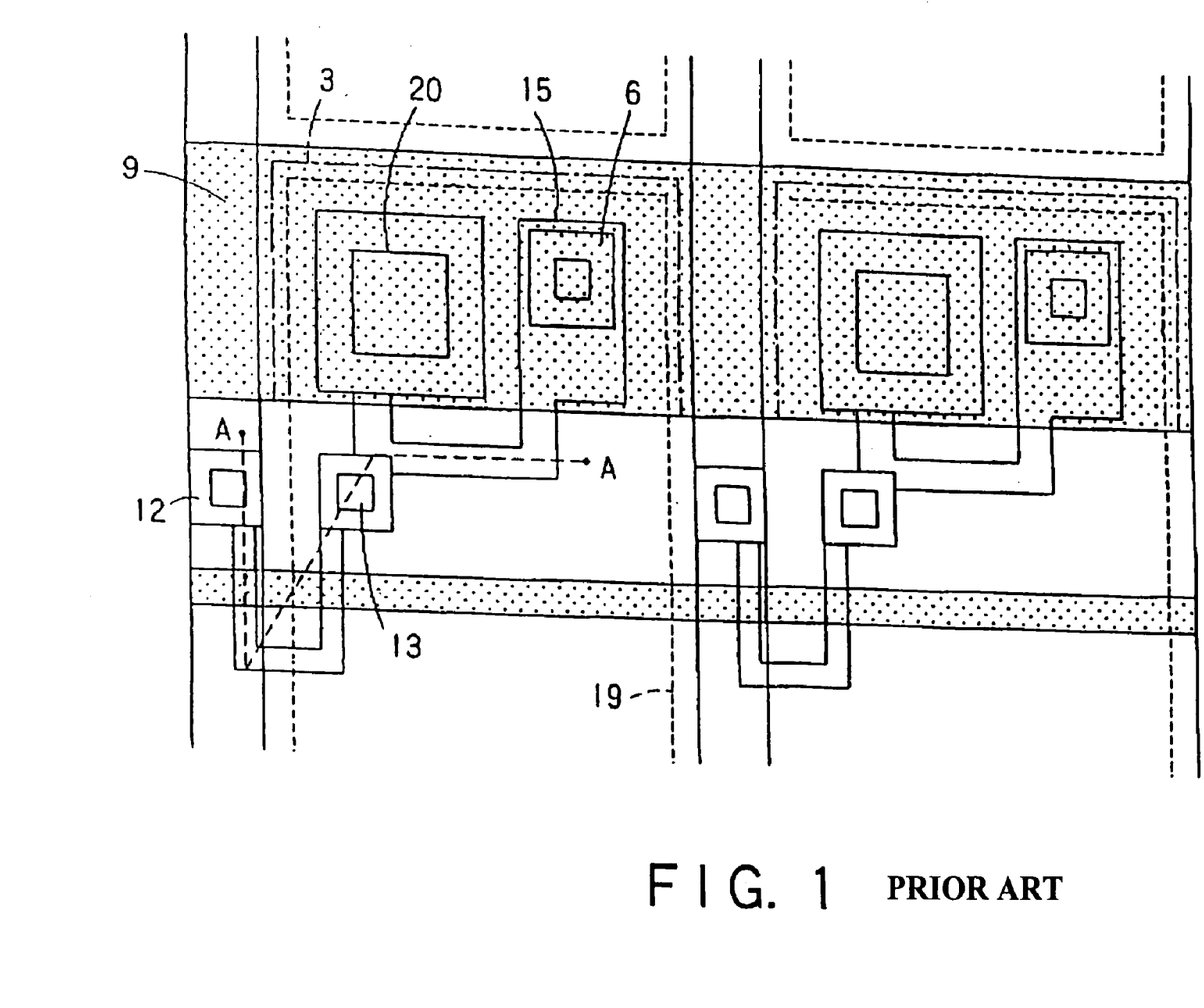
FIG. 1 is a top view showing a structure of a liquid crystal display using a conventional TFT.
Figure 2:
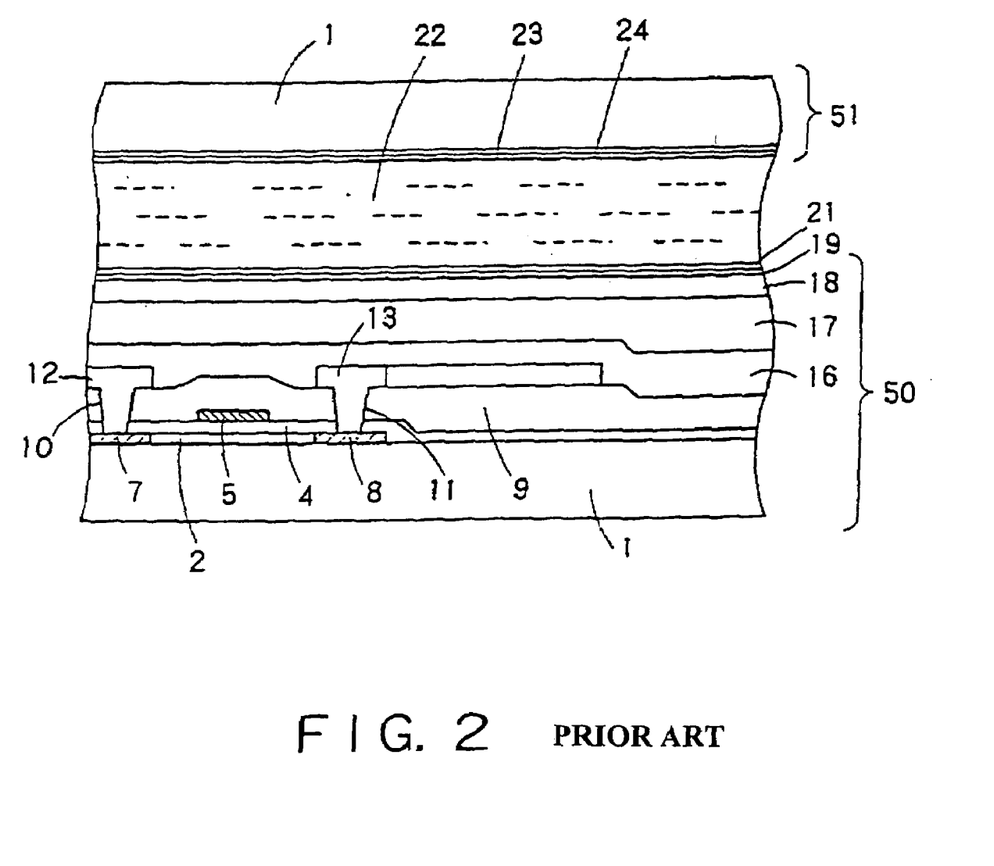
FIG. 2 is a sectional view along line A—A of FIG. 1.

FIG. 1 is a top view showing a structure of the liquid crystal display using this type of TFT, and FIG. 2 is a sectional view along line A—A of FIG. 1.

A method of manufacturing the liquid crystal display of FIG. 1 will briefly be described hereinafter. After forming a semiconductor layer 2 of polycrystalline silicon on the top surface of a glass substrate 1, and forming a gate insulating film 4 to cover the semiconductor layer 2, a gate electrode 5 as a first wiring layer is formed on the top surface.

A pixel electrode 19 and an auxiliary capacity electrode 3 are connected to TFT for displaying a pixel. The auxiliary capacity is structured such that the gate insulating film 4 is held between the auxiliary capacity electrode 3 formed by the semiconductor layer 2 and an auxiliary capacity feeder 6 formed on the same layer as that of the gate electrode 5.

For the TFT shown in FIG. 1, since polycrystalline silicon is used as a material of the semiconductor layer 2, field-effect mobility is high, and even with individual miniaturized TFTs, a sufficient drive ability can be obtained. Therefore, when this type of TFT is used to constitute the active matrix liquid crystal display, aperture ratio and luminance can be enhanced, and power consumption can be reduced.

Moreover, since this type of TFT has a high field-effect mobility, it is also possible to form a drive circuit such as a shift register for controlling TFT operation on the same glass substrate as that of an image display area. Therefore, it is unnecessary to separately dispose a TFT driving substrate, an external circuit can be simplified, and manufacture process and cost can be reduced.

However, in the liquid crystal display of FIG. 1, because of surface property of the auxiliary capacity electrode 3, mixture of foreign particles in the course of manufacture, and the like, insulating property of the capacity insulating film (gate insulating film) 4 of the auxiliary capacity becomes insufficient, a defect of short-circuiting the pixel electrode 19 and auxiliary capacity feeder 6 occurs, and manufacture yield is deteriorated.

When such defect occurs, the corresponding pixel is fixed to a certain potential, and a constantly lit pixel defect occurs. Moreover, since a direct-current voltage continues to be applied between opposite electrodes, a liquid crystal composition contained in a liquid crystal layer corresponding to a pixel area is deteriorated, and reliability is also deteriorated.

As one technique of repairing this pixel defect, there is proposed a technique of irradiating, with a laser beam, an auxiliary capacity electrode portion in which a short-circuit defect occurs to cut this portion, thereby electrically cutting the above portion from the pixel electrode. In this case, the repaired pixel is influenced by a parasitic capacity between a signal line and the pixel electrode, but is improved to obtain a semi-lit state.

However, in a wiring BM structure as a pixel structure for realizing a high aperture ratio, since a wiring portion is vertically superposed on the pixel electrode, by cutting a part of the wiring portion with a laser beam, a new short-circuit defect possibly occurs by the laser beam.

In order to avoid such possibility, it is necessary to connect the auxiliary capacity electrode to the switching element beforehand via the wiring to be cut, and to detect and cut off a short-circuit place before forming the pixel electrode.

However, a finding ratio of the short-circuit place is not 100% in a state of array substrate, and after completing the array substrate, the short-circuit place newly found after the substrate is placed onto an opposite substrate cannot be repaired.

SUMMARY OF THE INVENTION

The present invention has been developed in consideration of this respect, and an object thereof is to provide a flat display in which a display defect pixel can be repaired with high reliability and a method of manufacturing the flat display.

Another object of the present invention is to provide a flat display in which after completing the flat display, a short-circuit defect place of an auxiliary capacity signal line and auxiliary capacity electrode can be repaired and a method of manufacturing the flat display.

In order to attain the aforementioned objects, according to the present invention, there is provided a method of manufacturing a flat display provided with an array substrate comprising: a signal line layer and a scanning line layer longitudinally and transversely arranged on an insulating substrate; a plurality of pixel electrodes connected to respective intersections of the signal line layer and the scanning line layer via switching elements; an auxiliary capacity electrode electrically connected to the switching element via a semiconductor wiring; and an auxiliary capacity feeder disposed opposite to the auxiliary capacity electrode via an insulating layer.

The method comprises a step of irradiating a portion of the semiconductor wiring with a laser light in such a manner that a laser intensity R ($\mu$J) and a volume V ($\mu m^3$) of the wiring portion satisfy a relation of equation (1).

$$0.01 \times V + 0.6 < R < 0.1 \times V + 1.5 \qquad (1)$$

According to the present invention, since the wiring portion between the switching element and the auxiliary capacity electrode is irradiated with the laser light shown in the equation (1), the pixel electrode fails to be influenced by a voltage of the auxiliary capacity feeder, the display pixel defect can be repaired with good reliability, and manufacture yield can be enhanced.

Moreover, there is provided a flat display provided with an array substrate comprising; signal lines and scanning lines longitudinally and transversely arranged on an insulating substrate; a plurality of pixel electrodes connected to respective intersections of the signal lines and the scanning lines via switching elements; a plurality of auxiliary capacity electrodes electrically connected to the switching elements; and an auxiliary capacity feeder disposed opposite to the auxiliary capacity electrode via an insulating layer.

The flat display comprises:

a first wiring layer connected to the auxiliary capacity electrode;

a second wiring layer connected to the switching elements and the first wiring layer; and a third wiring layer connected to an upper electrode connected to the pixel electrode and the switching elements.

The first and second wiring layers are vertically formed on different layers.

According to the present invention in which the first and second wiring layers are disposed as a connection path of the switching element and auxiliary capacity electrode, when a short-circuit defect between the auxiliary capacity electrode and the auxiliary capacity feeder is found upon completion of the array substrate, the second wiring layer is irradiated with a laser beam from the upper side of the substrate to cut the wiring layer. When the short-circuit defect between the auxiliary capacity electrode and the auxiliary capacity feeder is found after the completion of the flat display, the first wiring layer can be irradiated with the laser beam from the back surface of the substrate to cut the wiring layer.

DETAILED DESCRIPTION OF THE PREFERRED EMBODIMENTS

A flat display and a method of manufacturing the display according to the present invention will specifically be described hereinafter with reference to the drawings. As one example of the flat display, a liquid crystal display will be described hereinafter.

First Embodiment

Figure 3:
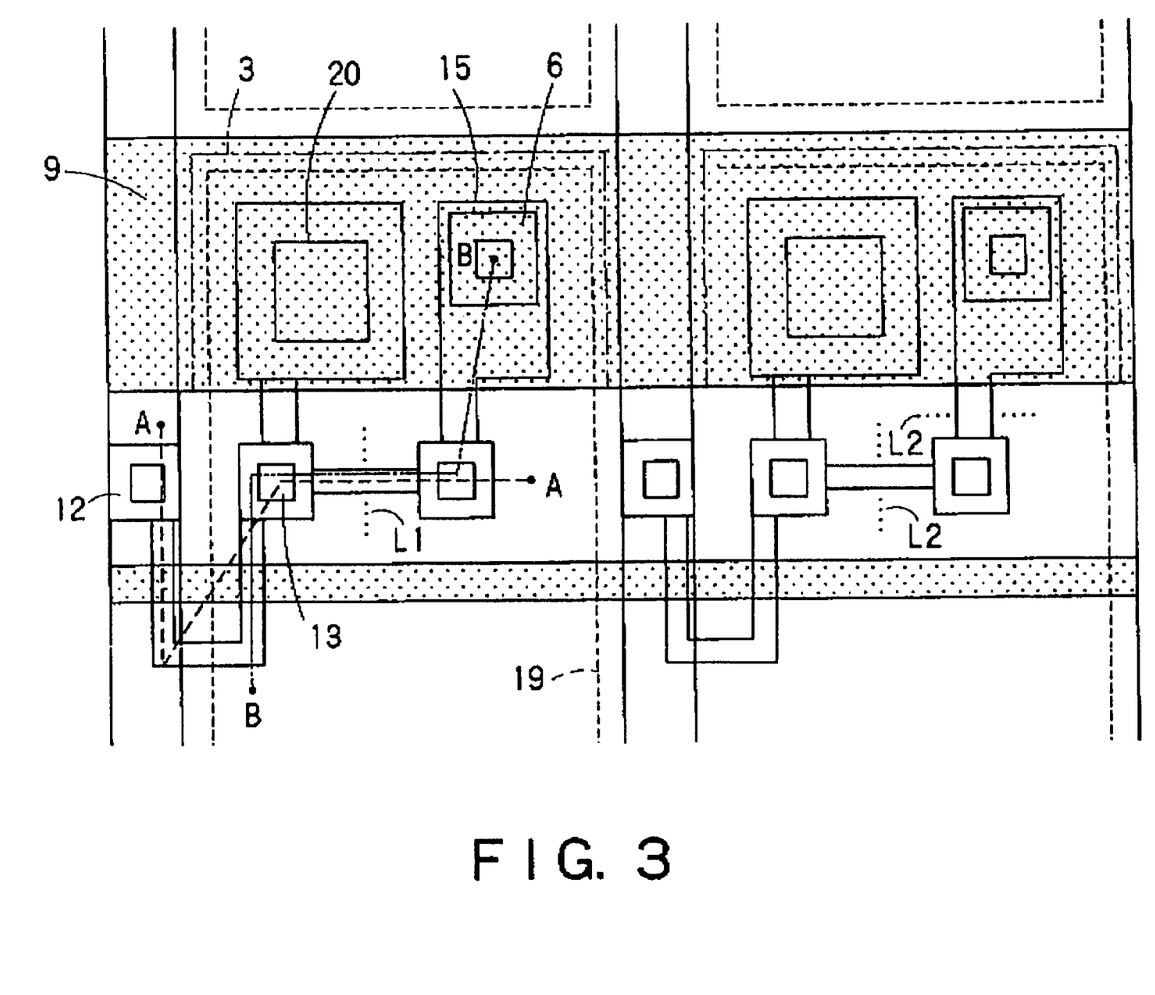
FIG. 3 is a top view showing one embodiment of a method of manufacturing a flat display according to the present invention.
Figure 4:
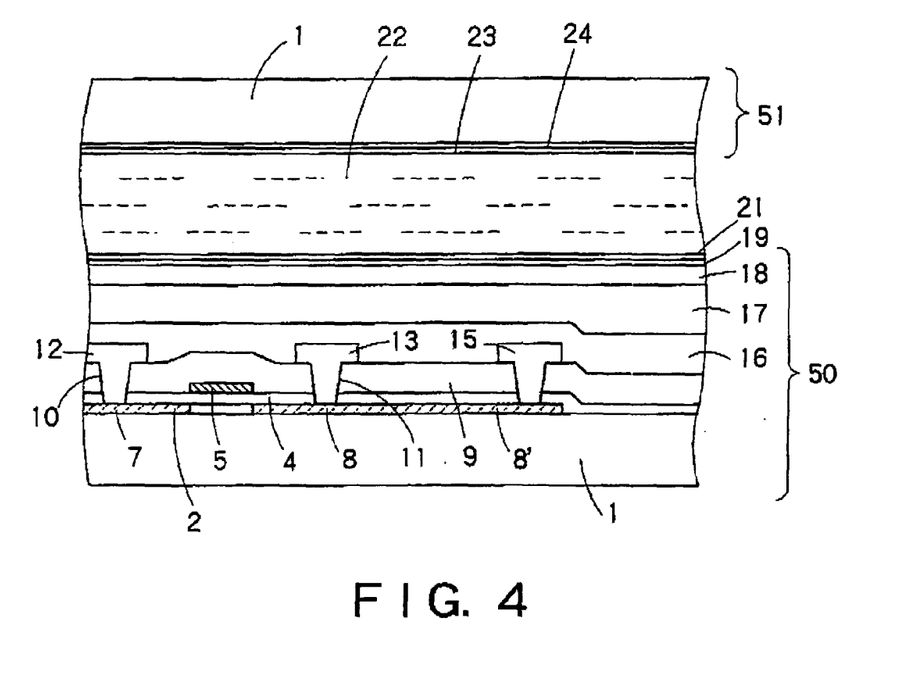
FIG. 4 is a sectional view along line A—A of FIG. 3.
Figure 5:
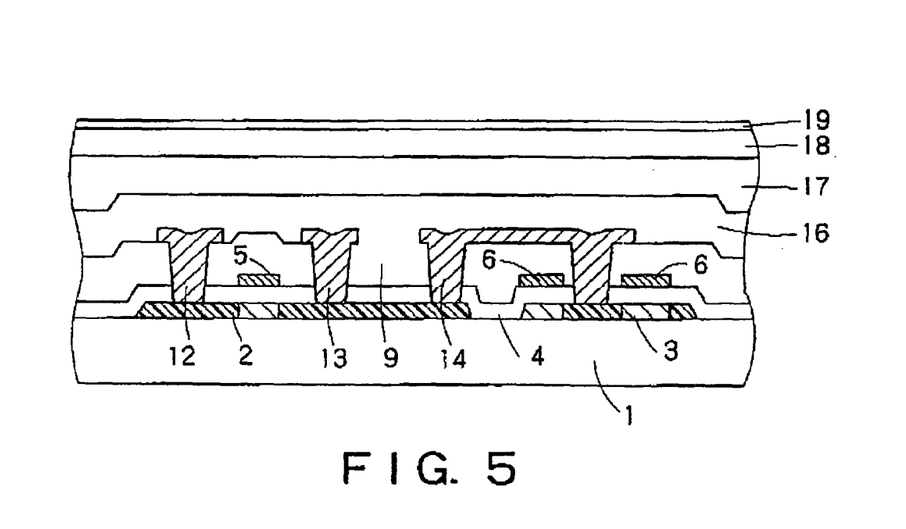
FIG. 5 is a sectional view along line B—B of FIG. 3.

FIG. 3 is a top view showing a liquid crystal display according to a first embodiment of the present invention, FIG. 4 is a sectional view along line A—A of FIG. 3, and FIG. 5 is a sectional view along line B—B of FIG. 3. In FIG. 5, for the sake of simplicity, an opposite substrate side is omitted.

The liquid crystal display of FIG. 3 is characterized in that a resistance of a wiring portion is heightened by irradiating the wiring portion with laser. Therefore, even if a pixel electrode short-circuits an auxiliary capacity feeder to generate a defect, the defect can effectively be repaired. The laser are irradiated with, for example, dotted lines L1, L2 of FIG. 3.

FIG. 6 shows sectional views showing a manufacture process of a semiconductor circuit of FIG. 3. A manufacture process of a semiconductor circuit of FIG. 3 will successively be described with reference to the sectional views.

Figure 6A:
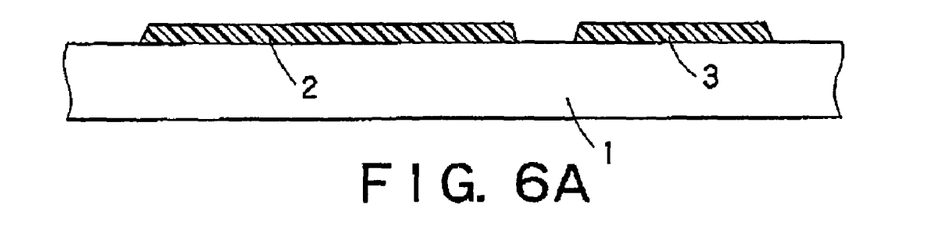
FIGS. 6A to 6D are sectional views showing a manufacture process of a semiconductor circuit of FIG. 3.

First, a non-crystalline silicon layer with a film thickness of 30 nm to 100 nm is formed on a glass substrate 1, for example, by a plasma CVD method. Subsequently, by crystallizing the non-crystalline layer, for example, by an excimer laser annealing method or the like to generate a polycrystalline silicon layer and by etching/processing the layer in an island shape by a photolithography process, a semiconductor layer 2 constituting TFT and connection wiring portion is formed. Additionally, an auxiliary capacity electrode 3 is formed by the polycrystalline silicon layer (FIG. 6A).

Figure 6B:
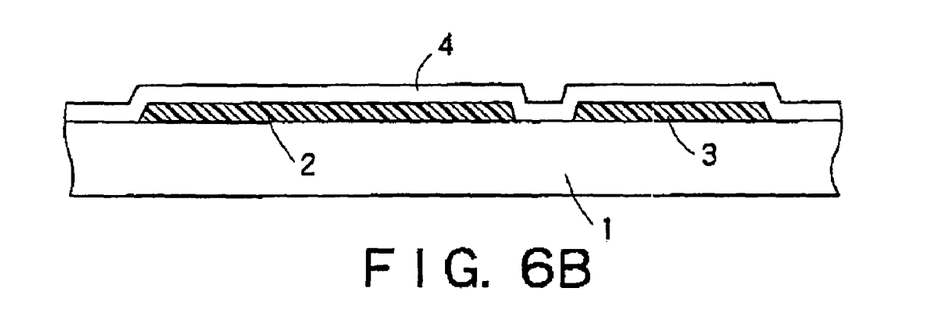

Subsequently, by forming, for example, a silicon oxide film in a thickness of about 100 nm on the top surface of the semiconductor layer 2, a gate insulating film 4 is formed (FIG. 6B).

Figure 6C:
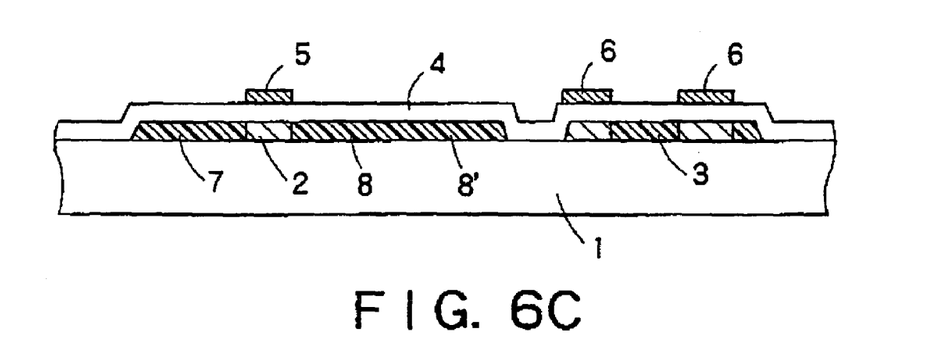

Next, by forming a first wiring layer (e.g., MoW alloy layer) by a sputtering method, and by subsequently etching/processing the MOW alloy layer by the photolithography method to strip a resist, a gate electrode 5 is formed. Additionally, an auxiliary capacity feeder 6 is also formed on the same layer (FIG. 6C).

Subsequently, the gate electrode 5 of the first wiring layer is used as a mask, for example, to perform doping of boron B with a high concentration. The doping is performed, for example, by ion injection, and an optimum dosage is of the order of $2 \times 10^{15}$ to $5 \times 10^{16}$ atoms/cm$^2$. By the doping, a source area low resistance semiconductor layer 7, a drain area low resistance semiconductor layer 8, and a connection wiring portion 8' extended from the drain area low resistance semiconductor layer 8 are formed (FIG. 6C).

Subsequently, the top surfaces of the gate electrode 5 and gate insulating film 4 are covered with silicon oxide or the like to form an interlayer insulating film 9. Subsequently, a partial area of the gate insulating film 4 and interlayer insulating film 9 positioned above the source area low resistance semiconductor layer 7 and drain area low resistance semiconductor layer 8 is etched removed by the photolithography method, and contact holes 10, 11 are formed.

Figure 6D:
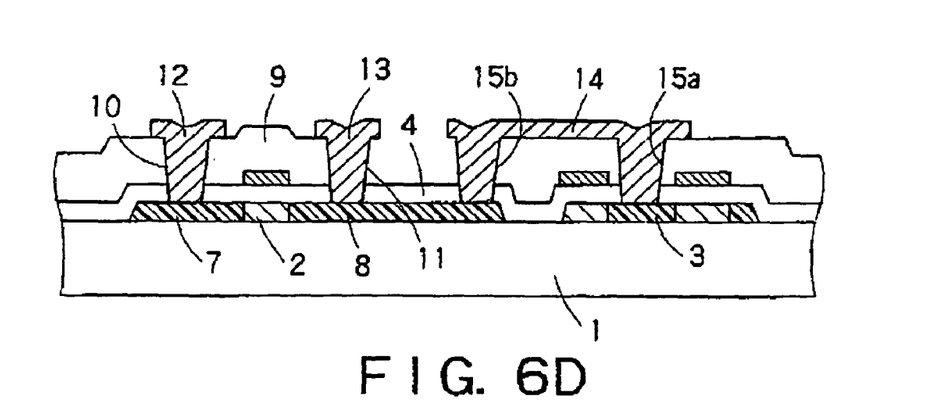

Moreover, an Al layer with a film thickness of about 500 nm is formed as a second wiring layer on the top surface of the interlayer insulating film 9 by the sputtering method, and etched/processed by the photolithography method to form a source electrode 12 and drain electrode 13.

The Al layer as a material forming the source electrode 12 is charged into the contact hole 10 and connected to the source area low resistance semiconductor layer 7. Similarly, the Al layer is also charged into the contact hole 11 and connected to the drain area low resistance semiconductor layer 8 (FIG. 6D).

A part of the auxiliary capacity electrode 3 is provided with a low resistance by an ion injection method or the like, and a contact hole 15a for embedding the second wiring layer is formed in the interlayer insulating film 9 positioned above the low-resistance portion.

Moreover, a contact hole 15b for embedding the second wiring layer is also formed in the interlayer insulating film 9 positioned above the end portion of the connection wiring portion 8'. Embedded in the contact holes 15a, 15b is a second wiring layer 14 which functions as a connection wiring.

Subsequently, as shown in FIG. 5, an insulating film 16 for protecting an element portion is formed on the top surface of the second wiring layer 14. A color filter layer 17 is formed on the top surface of the insulating film 16, an overcoat layer 18 is formed on the top surface, and further a pixel electrode 19 is formed on the top surface. The contact hole is formed in a part of the color filter layer 17, overcoat layer 18 and pixel electrode 19, and the contact hole forms a contact 20 to connect the pixel electrode 19 to the drain electrode 13 (FIG. 3).

Subsequently, an orientation film 21 of polyimide for orienting a liquid crystal molecule is formed on the top surface of the pixel electrode 19. As shown in FIG. 4, an array substrate 50 is completed by the aforementioned process.

The array substrate 50 is disposed opposite to an opposite substrate 51 having an orientation film 23, opposite electrode 24 and glass substrate 1, and a liquid crystal layer 22 is held and sealed between the substrates. The liquid crystal display is completed by the aforementioned process.

When insulation between the auxiliary capacity electrode 3 and the auxiliary capacity feeder 6 constituting an auxiliary capacity is insufficient, or electrically conductive foreign particles are mixed into the gate insulating film 4 between the auxiliary capacity electrode 3 and the auxiliary capacity feeder 6, a short-circuit defect occurs between the pixel electrode 19 and the auxiliary capacity feeder 6.

The present applicant has confirmed by experiment that when the connection wiring portion 8' is constituted by a semiconductor layer and the connection wiring portion 8' is irradiated with lasers having different intensities, there is a correlation between a wiring portion sectional shape and a liquid crystal specific resistance.

Figures 7, 8A, 8C:
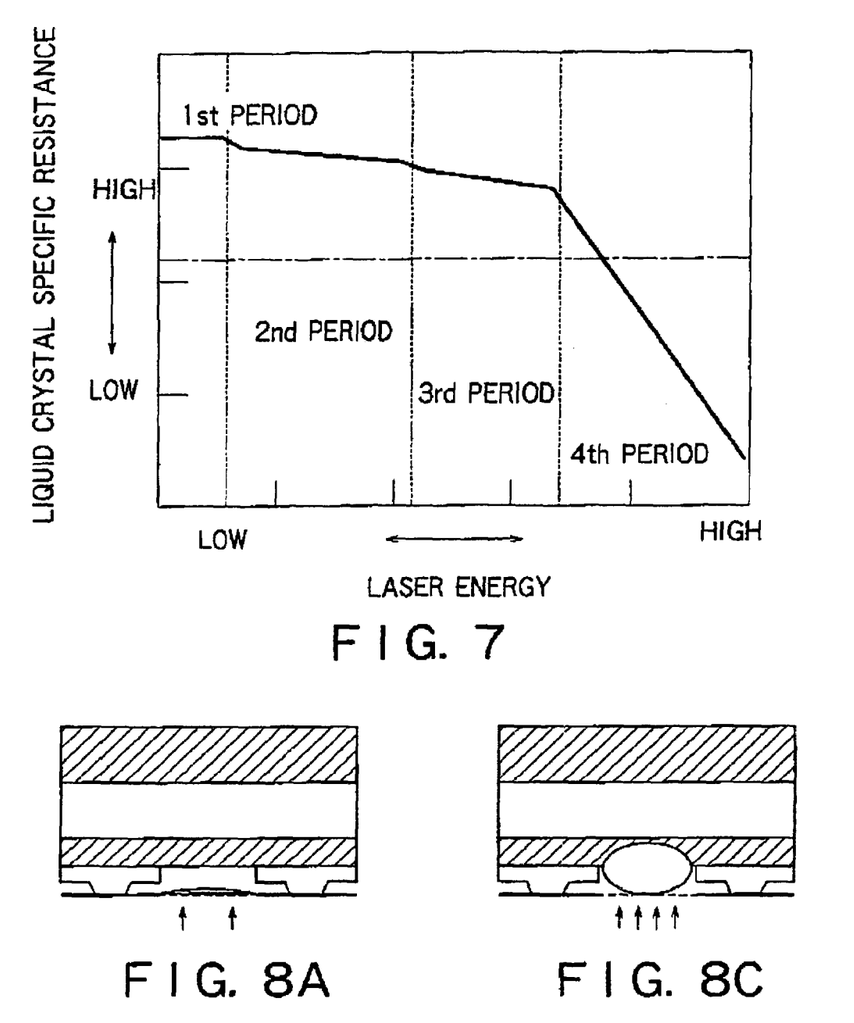
FIG. 7 is a graph in which the horizontal axis indicates a laser irradiation energy, and the vertical axis indicates a specific resistance of a liquid crystal.
FIGS. 8A to 8D are schematic views showing a state of a wiring portion of first to fourth periods.

FIG. 7 is a graph showing experimental results, the horizontal axis indicates a laser irradiation energy, and the vertical axis indicates the specific resistance of a liquid crystal. Additionally, FIG. 7 shows an example in which NRS-45 manufactured by NTN for the irradiation of laser having a wavelength of 532 nm is used.

Figure 8B:
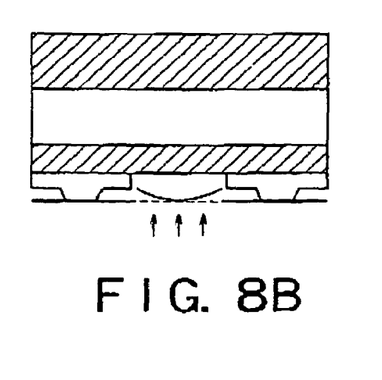
Figure 8D:
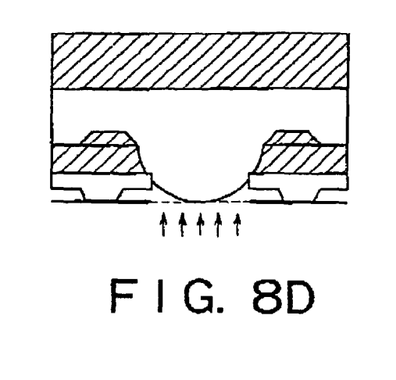

As shown in FIG. 7, four-step different properties of first to fourth periods were obtained by the laser irradiation energy. FIG. 8A is a schematic view showing a wiring portion state of the first period, FIG. 8B is a schematic view showing the wiring portion state of the second period, FIG. 8C is a schematic view showing the wiring portion state of the third period, and FIG. 8D is a schematic view showing the wiring portion state of the fourth period.

In the first period, a polysilicon layer constituting the connection wiring portion 8' vanishes or changes its color, and in this state, the specific resistance of a laser irradiation position is still high.

In the second period, a conical crack extends from the center of the laser irradiation position to the peripheral interlayer insulating film 9. In this state, the conical crack fails to reach the liquid crystal layer, the insulating layer 9 fails to contact the liquid crystal layer 22, and the specific resistance is hardly deteriorated.

In the third period, the crack is enlarged to form a cavity, and a part of the cavity comes in contact with the liquid crystal layer 22, but the resistance is only slightly deteriorated as compared with the second period.

In the fourth period, most of the insulating layer 9 flies into the liquid crystal, flying substances deteriorate the specific resistance in the liquid crystal, and a so-called display unevenness easily occurs.

The present applicant has set the laser irradiation energy in such a manner that the state of the second period to a part of the fourth period of FIG. 8 is maintained, and has enhanced a display quality.

Figure 9:
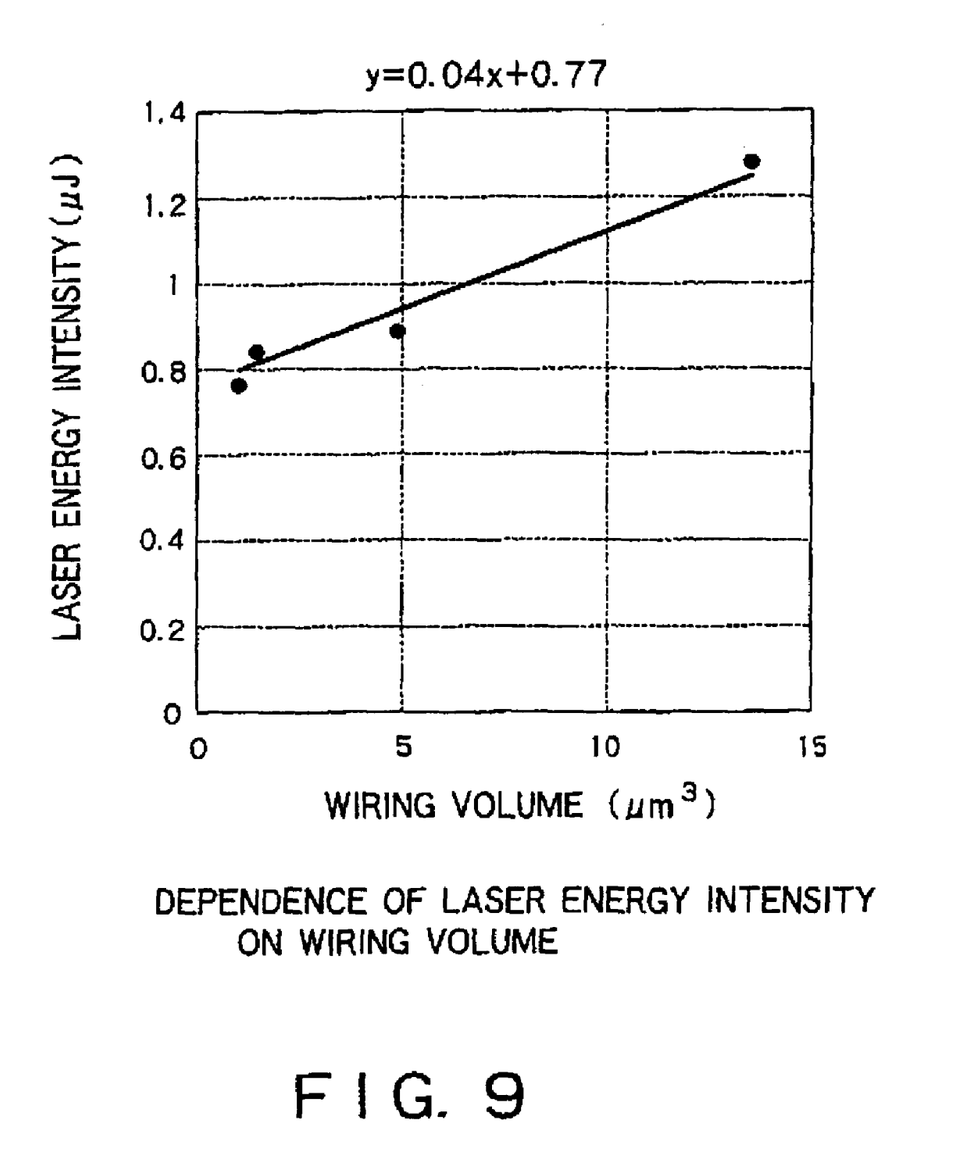
FIG. 9 is a chart showing a relation between a volume of the wiring portion erased by laser (horizontal axis) and a laser energy indicating a resistance at which display property recovery is possible (vertical axis).

Moreover, as shown in FIG. 9, the present applicant has found that there is a correlation between a volume of the wiring portion erased by laser (horizontal axis) and a laser energy indicating the resistance at which display property recovery is possible (vertical axis).

As shown in FIG. 9, when the volume of the wiring portion is known, the laser irradiation energy by which high resistance can be provided can be obtained. Conversely, when the laser irradiation energy is predetermined, the wiring portion can be provided with the high resistance by setting the wiring portion's volume to a value in accordance with the laser irradiation energy.

The present applicant took both properties of FIGS. 8 and 9 into consideration, and conducted an experiment on the following condition. First, by irradiating a dotted line portion L1 or L2 of FIG. 3 with the laser energy for the second period of FIG. 8, the specific resistance is prevented from being deteriorated. Subsequently, by referring to FIG. 9 and setting the laser energy to satisfy equation (1), the high resistance of the wiring is realized.

$$0.01 \times V + 0.6 < R < 0.1 \times V + 1.5 \tag{1}$$

According to FIG. 9, the laser energy for realizing the second period is 0.8 µJ. Therefore, a width of the wiring portion consisting of polycrystalline silicon was set to 500 angstroms, and a wiring area was 6 µm×3 µm. As a result, in the liquid crystal display in which there is a short circuit between the auxiliary capacity electrode 3 and the auxiliary capacity feeder 6, the wiring portion can be provided with the high resistance without flying the portion in the liquid crystal, and a manufacture process with a high reliability can be obtained.

Second Embodiment

Figure 10:
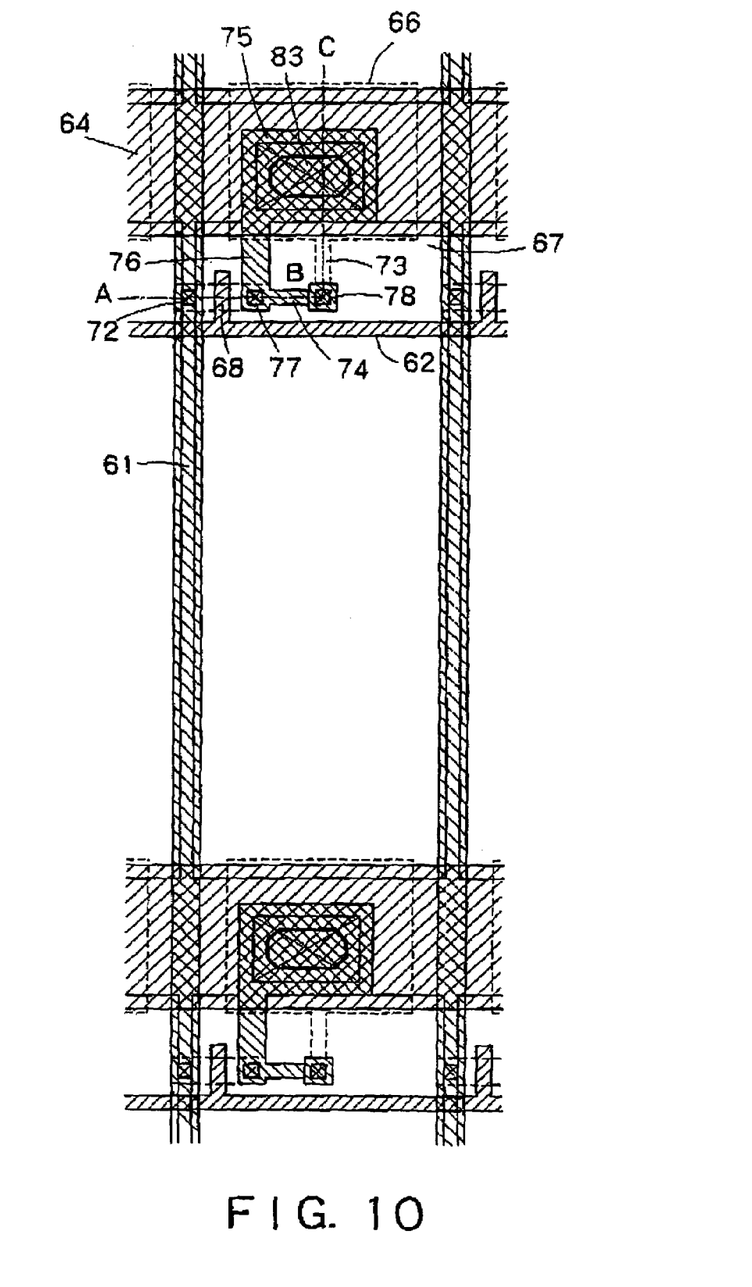
FIG. 10 is a plan view of the liquid crystal display according to a second embodiment of the present invention.
Figure 11:
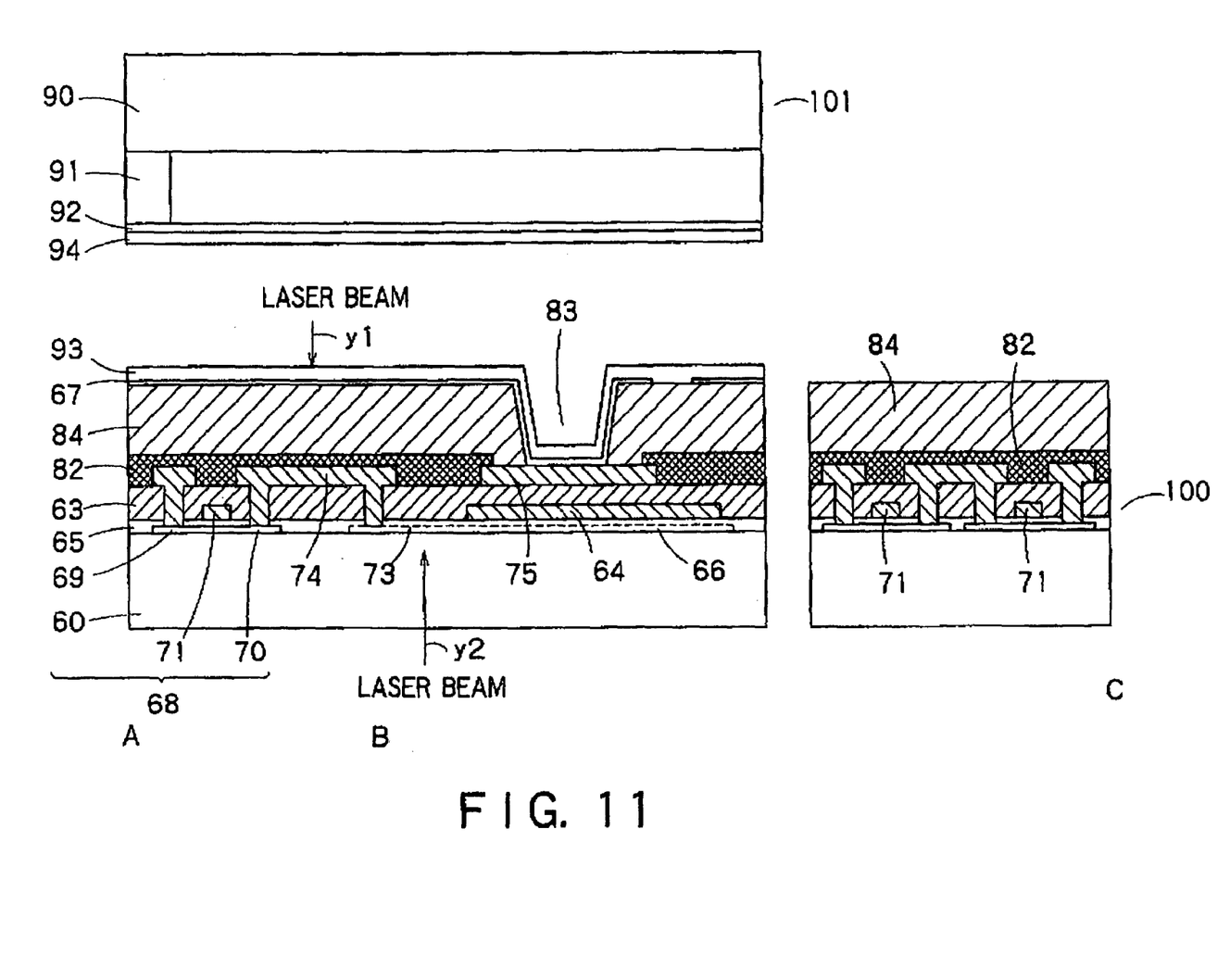
FIG. 11 is a sectional view along line A-B-C of FIG. 10.

FIG. 10 is a plan view of the liquid crystal display according to a second embodiment of the present invention, and FIG. 11 is a sectional view along line A-B-C of FIG. 10. The liquid crystal display of the present embodiment is provided with a signal line 61 and a scanning line 62 longitudinally and transversely arranged. The signal line 61 crosses at right angles to the scanning line 62 and an auxiliary capacity feeder 64 via an interlayer insulating film 63. The auxiliary capacity feeder 64 is formed on the same layer as the scanning line 62, and parallel to the scanning line 62. An area defined by the signal line 61 and auxiliary capacity feeder 64 corresponds to one pixel area.

A part of the auxiliary capacity feeder 64 is disposed opposite to an auxiliary capacity electrode 66 formed by a polysilicon film via a gate insulating film 65, and an auxiliary capacity element is formed between the auxiliary capacity feeder 64 and the auxiliary capacity electrode 66.

A pixel electrode 67 is disposed in such a manner that a peripheral edge is superposed onto the signal line 61 and auxiliary capacity feeder 64. A pixel thin film transistor (TFT) 68 functioning as a switching element is disposed in the vicinity of an intersection of the signal line 61 and scanning line 62.

The pixel TFT 68 is provided with a drain electrode 69 and source electrode 70 formed by a polysilicon film, and a gate electrode 71 formed of a partial area of the scanning line 62 formed via the gate insulating film 65. The drain electrode 69 is electrically connected to the signal line 61 via a contact hole 72.

The present embodiment is provided with a first wiring layer 73 connected to the auxiliary capacity electrode 66, a second wiring layer 74 connected to a source electrode of the pixel TFT 68 and the first wiring layer 73, and a third wiring layer 76 connected to an upper electrode 75 of an auxiliary capacity element and the source electrode 70 of the pixel TFT, and the first and second wiring layers 73, 74 are vertically formed on different layers.

More specifically, the source electrode 70 of the pixel TFT 68 is connected to the upper electrode 75 of the auxiliary capacity element via a contact hole 77 and the third wiring layer 76. The auxiliary capacity electrode 66 is connected to the second wiring layer 74 via the first wiring layer 73 and a contact hole 78, and the second wiring layer 74 is connected to the source electrode 70 of the pixel TFT 68.

The first wiring layer 73 is formed on the same layer as the auxiliary capacity electrode 66. The second and third wiring layers 74 and 76 are formed on the same layer as the upper electrode 75 of the auxiliary capacity electrode 66.

Figure 12:
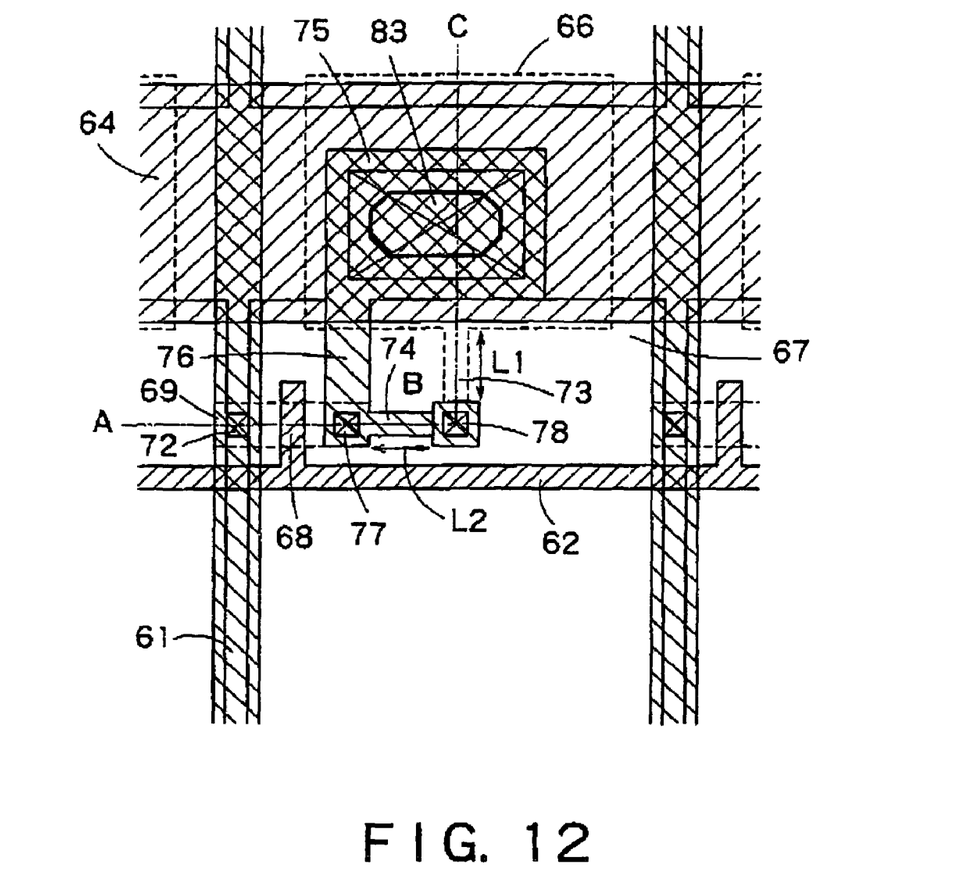
FIG. 12 is an enlarged view of FIG. 10.

At least a part of the first wiring layer 73 and at least a part of the second wiring layer 74 are disposed not to vertically overlap with auxiliary capacity feeder 64 and auxiliary capacity electrode 66. Preferably, as shown in FIG. 12, a length of the first wiring layer 73 is set to be substantially equal to the length of the second wiring layer 74. Therefore, even when either of the first and second wiring layers 73, 74 is irradiated with a laser beam, the wiring layer can securely be cut.

Moreover, the first wiring layer 73 is formed by a material different from materials of the second and third wiring layers 74, 76, the first wiring layer 73 is a lowermost wiring layer (e.g., polysilicon layer), and the second and third wiring layers 74, 76 form an uppermost wiring layer (e.g., Ta, and the like).

In the present embodiment, when a short-circuit place between the auxiliary capacity electrode 66 and the auxiliary capacity feeder 64 is detected in a state of an array substrate 100, that is, in a state before placing the substrate onto an opposite substrate 101 to form a cell, as shown by an arrow y1 of FIG. 11, the laser beam is applied from the upper side of the array substrate 100 to cut the second wiring layer 74. On the other hand, after cell formation, as shown by an arrow y2 of FIG. 11, the laser beam is applied from the lower side of the array substrate 100 to cut the first wiring layer 73.

Figure 13:
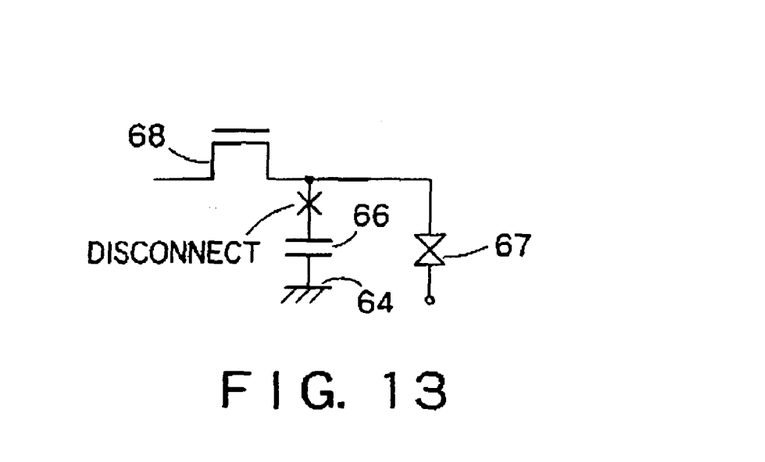
FIG. 13 is an equivalent circuit diagram around a pixel TFT.

FIG. 13 is an equivalent circuit diagram around the pixel TFT 68. A position shown by "x" of FIG. 13 is cut.

The conventional liquid crystal display is not provided with the first wiring layer 73. Therefore, when the short-circuit place of the auxiliary capacity electrode 66 and auxiliary capacity feeder 64 cannot be detected before completion of the array substrate 100, the short circuit detected after the completion of a liquid crystal cell cannot be repaired. The reason is that the second wiring layer 74 for connecting the source electrode 77 of the pixel TFT 68 to the auxiliary capacity electrode 66 is formed in the vicinity of the pixel electrode 67, and the pixel electrode 67 is possibly influenced by the laser beam applied from the back surface side of the substrate. Moreover, since the interlayer insulating film 63 is disposed between the second wiring layer 74 and a glass substrate 60, it is difficult to irradiate a desired position of the second wiring layer 74 with the laser beam.

Figure 14:
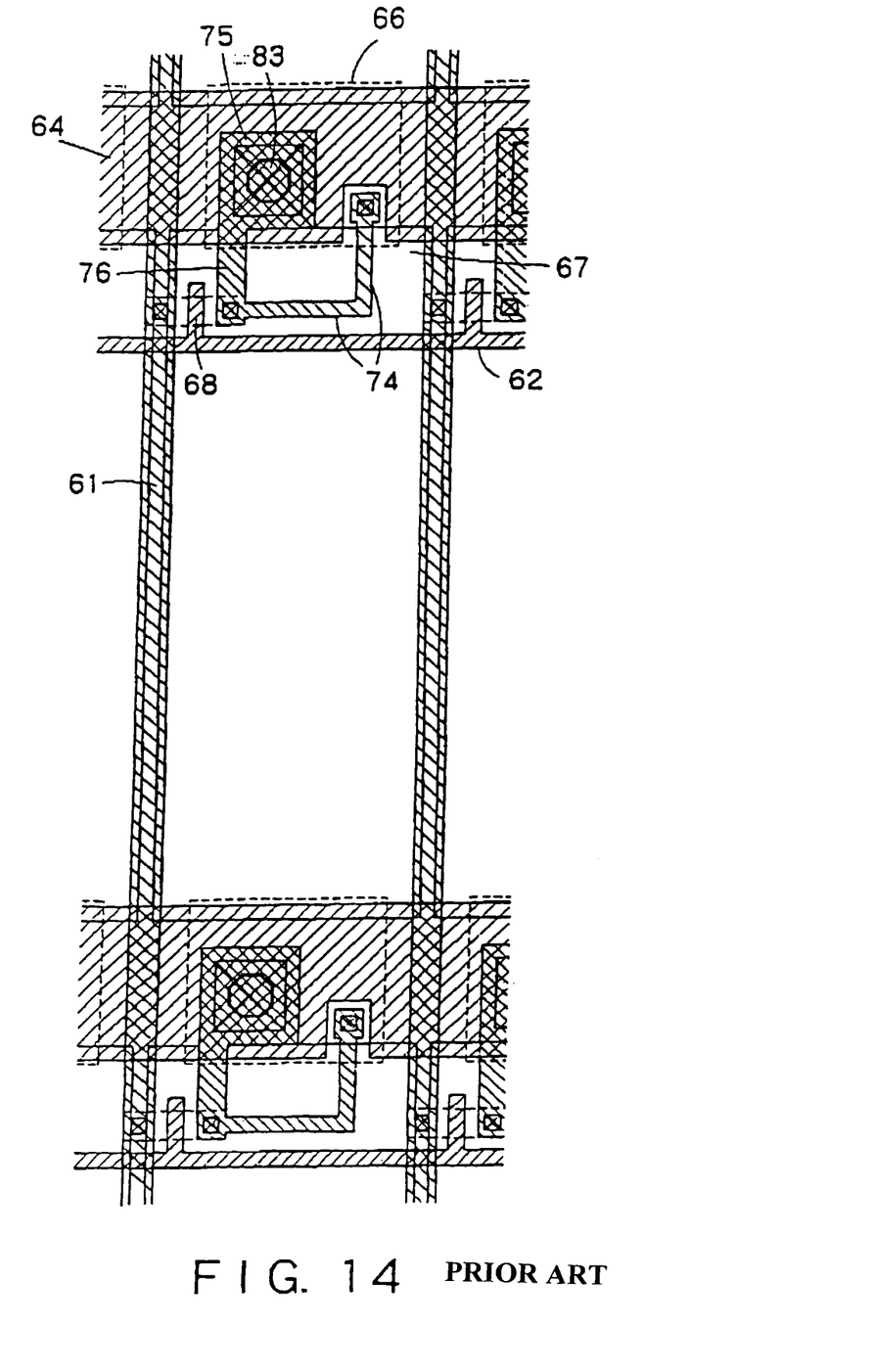
FIG. 14 is a plan view of a conventional example for connecting an auxiliary capacity electrode to the pixel TFT via a second wiring layer without disposing a first wiring layer.

FIG. 14 is a plan view of a conventional example for connecting the auxiliary capacity electrode 66 to the pixel TFT 68 via the second wiring layer 74 without disposing the first wiring layer 73. In FIG. 14, when the short-circuit defect occurs between the auxiliary capacity electrode 66 and the auxiliary capacity feeder 64, it is necessary to cut the second wiring layer 74 by the laser beam, but the second wiring layer 74 is formed on the same layer as the upper electrode 75, the pixel electrode 67 is therefore possibly influenced by the laser beam, and the second wiring layer 74 cannot precisely be irradiated with the laser beam, because of the presence of the interlayer insulating film 63.

On the other hand, in the present embodiment, by irradiating the first wiring layer 73 with the laser beam from the back surface of the substrate, the second wiring layer 74 can be cut without influencing the pixel electrode 67. Specifically, since the insulating film 63 is formed on the top surface of the first wiring layer 73 as shown in FIG. 11, even by the irradiation of the second wiring layer 74 with the laser beam from the back surface side of the substrate as shown by an arrow y2, the laser beam cannot reach the pixel electrode 67. Moreover, since the first wiring layer 73 is formed to closely abut on the glass substrate 60, the first wiring layer 73 can securely be irradiated with the laser beam. Therefore, repair precision can be enhanced, and the liquid crystal display with a high reliability is obtained.

FIG. 15 show sectional views showing a manufacture process of the liquid crystal display of the present embodiment. The manufacture process of the liquid crystal display of the present embodiment will be described hereinafter with reference to FIG. 15. First, an amorphous silicon film is formed in about 50 nm on a translucent insulating substrate such as a high strain point glass substrate and a quartz substrate by a CVD method or the like (FIG. 15A).

Figure 15A:
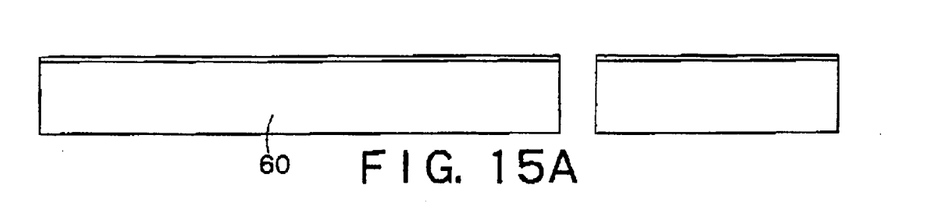
FIGS. 15A to 15E are sectional views showing a manufacture process of the liquid crystal display of the present embodiment.
Figure 15B:
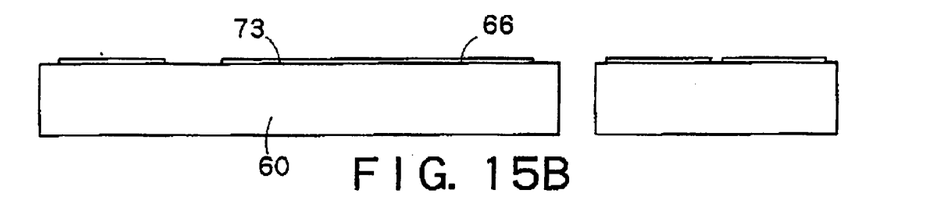

Subsequently, by performing furnace annealing at 450° C. for about one hour, and applying XeCl excimer laser, amorphous silicon is poly-crystallized. Subsequently, by patterning polycrystalline silicon by a photoetching method, a polysilicon film is formed to form a channel layer of the pixel TFT 68 in a display area and a channel layer of TFT (circuit TFT) of a drive circuit area, and the auxiliary capacity electrode 66 for forming an auxiliary capacity and the first wiring layer 73 connected to the auxiliary capacity electrode 66 are formed (FIG. 15B).

Figure 15C:
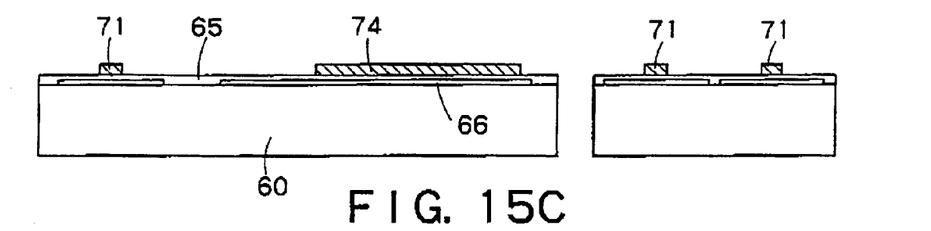

Subsequently, by the CVD method, the entire surface of the insulating substrate is coated with an SiOx film in about 100 nm to form the gate insulating film 65, the entire top surface of the SiOx film is subsequently coated with simplex metals such as Ta, Cr, Al, Mo, W, Cu, a laminated film of these metals or an alloy film in about 400 nm, and a predetermined shape is patterned by the photoetching method (FIG. 15C). As a result, the scanning line 62, auxiliary capacity feeder 64, gate electrode 71 of the pixel TFT 68, gate electrode 71 of the circuit TFT, and various wirings in the drive circuit area are formed.

Subsequently, the gate electrode 71 is used as the mask to inject impurities by an ion injection or ion doping method, and the drain electrode 69 and source electrode 70 of the pixel TFT 68 and the source electrode 70 and drain electrode 69 of an Nch type circuit TFT 85 are formed. For impurity injection, phosphorus is injected by $PH_3/H_2$ in a high concentration, for example, with an acceleration voltage of 80 keV and dosage of $5 \times 10^{15}$ atoms/cm$^2$.

Subsequently, after coating TFT with a resist in such a manner that impurities are prevented from being injected to the pixel TFT 68 or the Nch type circuit TFT 85 of the drive circuit area, the gate electrode 71 of a Pch type circuit TFT 86 is used as the mask to inject boron by $B_2H_6/H_2$ in the high concentration by an acceleration voltage of 80 keV and dosage of $5 \times 10^{15}$ atoms/cm$^2$, and the source electrode 70 and drain electrode 69 of the Pch type circuit TFT 86 are formed.

Subsequently, the impurity injection is performed to form an Nch type lightly doped drain (LDD), and the substrate is annealed to activate the impurities. Subsequently, for example, a PECVD method is used to coat the entire surface of the insulating substrate with the film 63 of $SiO_2$ in about 500 nm.

Figure 15D:
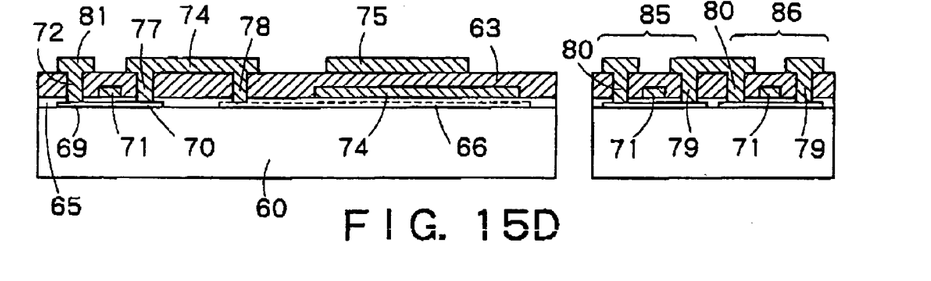

Subsequently, the contact hole 72 extending to the drain electrode 69 of the pixel TFT 68, the contact hole 77 extending to the source electrode 70, the contact hole 78 extending to the first wiring layer 73, and contact holes 79, 80 extending to the source electrode 70 and drain electrode 69 of the circuit TFT are formed by the photoetching method (FIG. 15D).

Subsequently, by forming a coat of simplex metals such as Ta, Cr, Al, Mo, W, and Cu, laminated film of these metals or alloy film in about 500 nm, and performing patterning to form a predetermined shape by the photoetching method, the signal line 61, a connection area 81 of the drain electrode 69 of the pixel TFT 68 and the signal line 61, the second wiring layer 74 for connecting the source electrode 70 to the first wiring layer 73, the upper electrode 75 of the auxiliary capacity element, various wiring areas of the circuit TFT in the drive circuit area, and the like are formed (FIG. 15D).

Figure 15E:
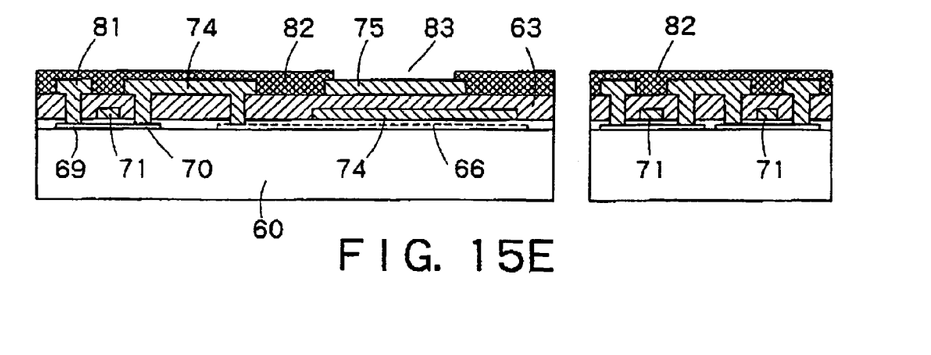

Subsequently, a protective insulating film 82 of SiNx is formed on the entire surface of the insulating substrate by the PECVD method, and a contact hole 83 extending to the upper electrode 75 of the auxiliary capacity element is formed by the photoetching method (FIG. 15E).

Subsequently, an organic insulating film 84 is coated to the entire surface in about 2 μm, and the contact hole 83 extending to the upper electrode 75 of the auxiliary capacity element is formed.

Finally, by forming an ITO film of about 100 nm by the sputtering method, and patterning the predetermined shape by the photoetching method, the pixel electrode 67 is formed. By connecting the pixel electrode 67 to the upper electrode 75, the array substrate 100 shown in FIG. 11 is completed.

On the other hand, by forming a color layer 91 with a pigment or the like dispersed therein, for example, on a glass substrate 90 as a transparent insulating substrate, and by forming an opposite electrode 92 as a transparent electrode, for example, of ITO on the top surface by the sputtering method, an opposite substrate 101 is obtained.

Subsequently, orientation films 93, 94 of low-temperature curing polyimide are printed/coated onto the entire surface on the side of a surface for forming the pixel electrode 67 of the array substrate 100 and the entire surface on the side of an opposite electrode forming surface of the opposite substrate 101, and rubbing treatment is performed in such a manner that an orientation axis forms an angle of 90° when both substrates are disposed opposite to each other. Thereafter, both substrates are disposed opposite to each other and assembled to form a cell, and a nematic liquid crystal is injected and sealed in a gap between the substrates. Subsequently, by attaching a deflection plate to the insulating substrate side of both substrates, the liquid crystal display is obtained.

In the liquid crystal display completed in this manner, the source electrode 70 of the pixel TFT 68 is electrically connected to the auxiliary capacity electrode 66 via the first and second wiring layers 73 and 74. Because of this, for the short-circuit place between the auxiliary capacity electrode 66 and the auxiliary capacity feeder 64 which could not be repaired at the time of completion of the array substrate 100, by applying the laser beam from the back surface of the array substrate 100 after cell completion to cut the wiring layer 73, the auxiliary capacity electrode 66 can electrically be cut from the pixel electrode 67. Therefore, even after the cell is completed, the short-circuit defect between the auxiliary capacity electrode 66 and the auxiliary capacity feeder 64 can be repaired.

In the aforementioned second embodiment, the active matrix liquid crystal display in which the semiconductor layers such as the channel area of the pixel TFT 68 are formed of polysilicon has been described, but the semiconductor layer may be formed using materials other than polysilicon.

In the respective embodiments, the example to which the method of manufacturing the liquid crystal display of the present invention is applied has been described, but the present invention can be applied to various flat displays other than the liquid crystal display, such as a plasma display panel apparatus (PDP).

What is claimed is:

1. A flat display provided with an array substrate having an upper side and a lower side, the array substrate comprising: signal lines and scanning lines longitudinally and transversely arranged on an insulating substrate; a plurality of pixel electrodes connected to respective intersections of said signal lines and said scanning lines via switching elements; a plurality of auxiliary capacity electrodes electrically connected to said switching elements; and an auxiliary capacity feeder disposed opposite to said auxiliary capacity electrode via an insulating layer, said flat display comprising:

a first wiring layer electrically connected to said auxiliary capacity electrode;

a second wiring layer electrically connected to source electrodes of said switching elements and said first wiring layer; and a third wiring layer electrically connected to said pixel electrode and the source electrodes of said switching elements, wherein said first wiring layer is formed on a layer closer to the lower side of the array substrate than the second wiring layer and the second wiring layer is formed on a layer closer to the upper side of the array substrate than the first wiring layer, and a length of said first wiring layer is set to be equal to that of the second wiring layer.

2. The flat display according to claim 1 wherein said second wiring layer and said auxiliary capacity feeder are formed not to be vertically superposed onto each other.

3. The flat display according to claim 1 wherein said first wiring layer is formed on the same layer as that of said auxiliary capacity electrode.

4. The flat display according to claim 1 wherein said second and third wiring layers are formed on the same layer.

5. The flat display according to claim 1 wherein a channel area of said switching element, said auxiliary capacity electrode and said first wiring layer are formed using polycrystalline silicon.

6. The flat display of claim 1, wherein:
the switching elements each include a gate, a drain, and the source electrode.

* * * * *